(12) United States Patent
Worley

(10) Patent No.: US 6,864,509 B2
(45) Date of Patent: Mar. 8, 2005

(54) PACKAGING OPTICALLY COUPLED INTEGRATED CIRCUITS USING FLIP-CHIP METHODS

(76) Inventor: Eugene Robert Worley, 11 Bowditch, Irvine, CA (US) 92620

( * ) Notice: Subject to any disclaimer, the term of this patent is extended or adjusted under 35 U.S.C. 154(b) by 477 days.

(21) Appl. No.: 10/012,809

(22) Filed: Feb. 6, 2002

(65) Prior Publication Data

US 2003/0147580 A1 Aug. 7, 2003

(51) Int. Cl.[7] ............................................. H01L 27/15
(52) U.S. Cl. ............................. 257/80; 257/81; 257/82; 257/83; 257/88; 257/777; 257/778
(58) Field of Search ................................ 257/80–83, 88, 257/777, 778; 385/14, 39, 49, 88, 89

(56) References Cited

U.S. PATENT DOCUMENTS

| 4,888,625 | A | * | 12/1989 | Mueller | 257/80 |
| 5,654,559 | A | * | 8/1997 | Spaeth et al. | 257/82 |
| 6,393,183 | B1 | * | 5/2002 | Worley | 385/39 |

* cited by examiner

Primary Examiner—Long Pham
Assistant Examiner—Wai-Sing Louie

(57) ABSTRACT

Packaging methods suitable for optically linking two silicon chips together for the purpose of optical isolation are shown. These packaging methods rely on the integration of Light Emitting Diodes (LEDs) onto one or both of the silicon chips as well as silicon light detectors. The packaging methods include optically linking of side by side silicon chips and vertically stacked chips.

17 Claims, 8 Drawing Sheets

PACKAGING OPTICALLY COUPLED INTEGRATED CIRCUITS USING FLIP-CHIP METHODS

BACKGROUND OF THE INVENTION

1. Field of the Invention

This invention relates to packing optically coupled integrated circuits, and more particularly to optically coupled integrated circuits using flip-chip packaging methodologies.

2. Prior Art

Most electronic opto-couplers use discrete LEDs and silicon detectors. The LED is typically made from GaAs and the detector chip from silicon. The detector chip can either be a single discrete device such as a PN junction diode or a bipolar transistor or a detector device with additional support circuits such as amplifiers, buffers, etc. Also, the LED may require external buffers or driver circuits which are typically made from silicon. Because of the need to both electrically isolate each group of said devices and the different materials of the various components such as GaAs and silicon, hybrid techniques are used to fabricate these isolation devices. An added complication to the packaging of electrically isolated devices is the need to optically couple these devices.

In one packaging approach described in U.S. Pat. No. 5,049,527 the detector and its associated circuitry if present are placed on one portion of a lead frame and the GaAs LED and its associated circuitry if present are placed on another portion of the lead frame. One portion of the lead frame is then bent 180° so that the LED and detector are facing each other.

In another approach shown in U.S. Pat. No. 4,755,474 a transparent dielectric layer is placed on the silicon detector. A GaAs LED is then placed on top of the dielectric layer. This packaging concept is shown for a single discrete silicon detector and a single discrete LED. Hybrid techniques have also been used for coupling light communication signals from LEDs or from light detectors to fiber optic cables such as that discussed in U.S. Pat. Nos. 4,904,036 and 4,186,994.

In U.S. Pat. No. 5,199,087 fiberoptic filaments are used to connect either LEDs or light detectors to wave guides for the purpose of making external connections. The methods used to connect the filament to the chip surface include fusing pressure and strength with epoxy glue.

Using light detectors in conjunction with high gain amplifiers, it is possible to use low efficiency silicon based LEDs, as well as more efficient GaAs LEDs which can be deposited on silicon, to realize signaling circuits which require electrical isolation. Silicon based LEDs include forward biased PN junction diodes, avalanche PN junction diodes, porous silicon diodes, and deposited silicon carbide diodes. For example, using two silicon integrated circuits with "on chip" LEDs it is possible to build a telephone line interface circuit referred to as Data Access Arrangement (DAA), to build computer communications ports requiring isolation such as RS232, to build byte wide or larger bi-directional isolated digital ports, or to build optically isolated analog voltage sources.

The aforementioned patents do not address methods of packaging opto couplers in which LEDs are integrated onto silicon chips as well as light detectors. Also, these patents do not address the case in which there are multiple optical links between two silicon chips.

SUMMARY OF THE INVENTION

It is the object of this invention to show methods of packaging two silicon chips with integrated LEDs and light detectors. These two chips are optically linked but electrically isolated from each other. This arrangement can be used to make complex opto coupler devices based on silicon integrated circuit technology. It is a further object of the present invention to seek packaging methods that minimize cost.

In one embodiment of the invention, a silicon integrated circuit die with appropriate optical devices is placed on a lead frame. A thick, transparent interlevel dielectric which is deposited using conventional silicon processing means is used as the isolation barrier. The top most metal level which is placed on top of the aforementioned thick dielectric layer is then used as a pad layer and a "flip chip" interconnect layer. The second die which is to be optically connected to the first die is then "flip chip" bonded to the pads of the aforementioned top most metal. The top most metal then provides another set of bondable pads leading out from the "flip chip" pads. These pads are then wire bonded to the lead frame. Optical coupling is achieved by the circuit side of each chip facing the other through a transparent insulator.

In another embodiment, a thin glass, plastic, or other suitable transparent insulator block or die is placed and glued onto the first silicon die. Metal is then deposited and patterned on top of transparent die such that the flip chip bonding of the second chip onto the transparent die is achieved. As before, the metal pattern brings out the flip chip bonding pads to wire bonding pads. In a variation of this approach, a thick deposited dielectric is used instead of the transparent die.

PRIOR ART STATEMENT

U.S. Pat. No. 5,049,527.
U.S. Pat. No. 4,755,474.
U.S. Pat. No. 4,904,036
U.S. Pat. No. 4,186,994
U.S. Pat. No. 5,199,087
A. Lacaita, F. Zappa, S. Bigliardi, and M. Manfredi, "On the Bremsstrahlung Origin of Hot-Carrier-Induced Photons in Silicon Devices", IEEE Trans. Electron Devices, vol. ED-40, p. 577, 1993.

BRIEF DESCRIPTION OF THE DRAWINGS

FIG. 2A shows a top view diagram of transparent light coupling device placed between two silicon integrated circuit die which uses a trench etched in silicon to align the light coupling device.

FIG. 2C shows a side cross section view (C-C') of the end of the light coupling device of FIG. 2A.

DESCRIPTION OF THE PREFERRED EMBODIMENTS

Figure 1A:
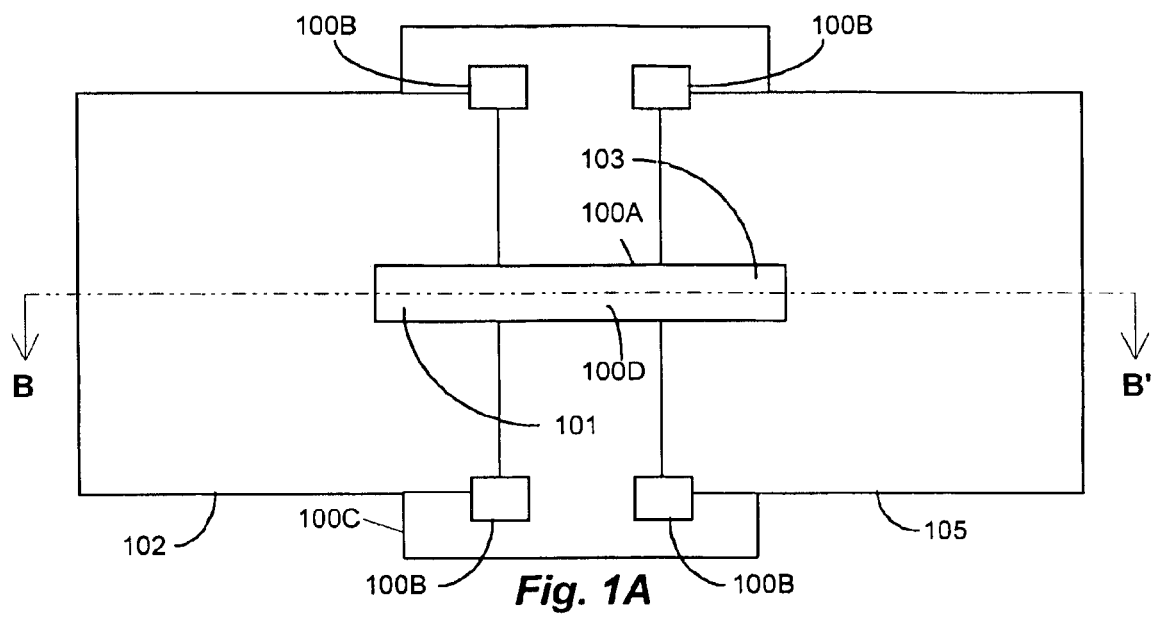
FIG. 1A shows a top view diagram of a transparent light coupling device placed between two silicon integrated circuit die which uses an "I" shaped block to align the device and two circuit die.
Figure 1B:
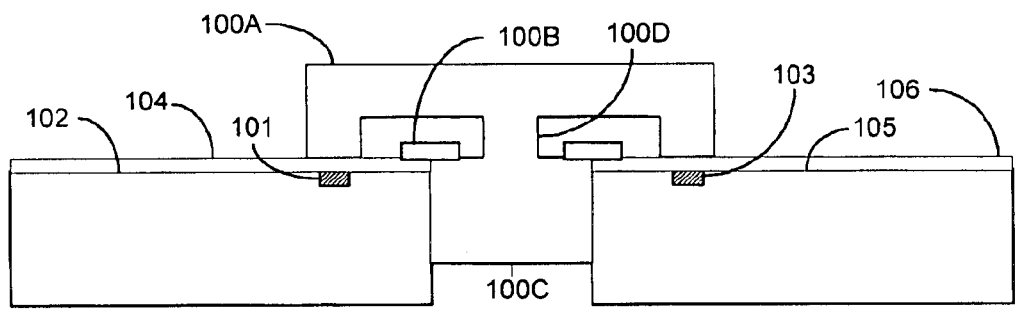
FIG. 1B shows a cross section side view diagram of the transparent light coupling device of FIG. 1A.

FIG. 1A show a top view of the clear plastic light coupling device 100 which is used to couple light from one silicon integrated circuit die 102 to another integrated circuit die 105. FIG. 1B is the corresponding side view of the assembly. The light coupling device 100 is molded into a single piece of plastic or other suitable material and has several physical structures related to various functions. The ends of the inverted "U" shaped structure 100A of FIG. 1B terminate on the LED 101 of die 102 and on the light detector 103 of die 105. It is assumed in this example that the LED 101 is a silicon PN junction diode operated in the avalanche mode which produces visible light and the light detector 103 is a PN junction diode. This does not, however, preclude the use of other types of integrated LEDs such as deposited silicon carbide, deposited light emitting polymer, etc. or other types of integrated light detectors such as bipolar transistors, Schottky barrier diodes, etc. A support post 100D is used to attach the "U" shaped light guide 100A to the main body 100C of the plastic device. The main body 100C of the light coupling device 100 is "I" shaped as seen in FIG. 1A and is used to position the two integrated circuits with respect to the "U" shaped light guide 100A. There are also 4 tabs 100B which are used to set the height of the main body 100C with respect to the surface of the die 102 and die 105. Shown at the surface of the die 102 and die 105 are the clear insulating layers 104 and 106 which are comprised of grown oxide and various deposited layers including the overcoat. The bonding pads for chips 102 and 105 are not shown but can be located on any of the 3 sides that do not include the light guide 100.

Figure 1C:
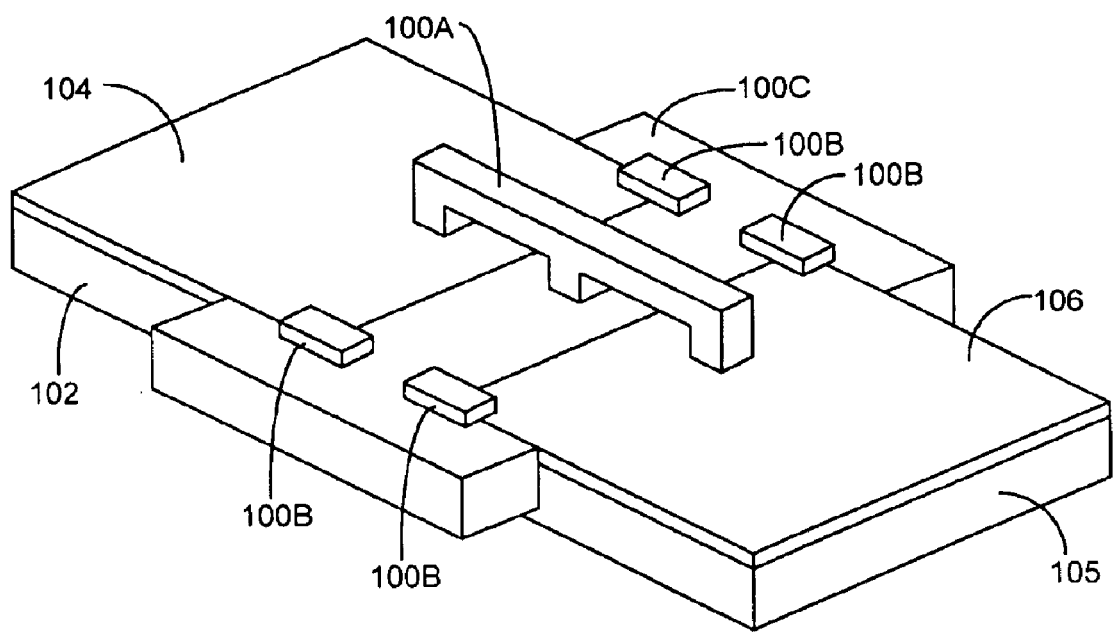
FIG. 1C shows an isometric view of the transparent plastic light coupling device of FIG. 1A.

FIG. 1C is an isometric perspective of the structure depicted in FIGS. 1A and 1B.

The assembly sequence is to take the clear light coupling device 100 and place it between the two die 102 and 105 before the two die are epoxied onto the lead frame. The "I" shaped portion 100C of the coupling device will position the die with respect to one another and with respect to the "U" shaped light wave guide 100A. The four tabs 100B will set the height of the coupling device 100 with respect to the die surface. To ensure good optical coupling between the surface of the integrated circuit die and the "U" shaped light wave guide 100A a thin layer of clear epoxy can be applied at the ends of the "U" before the coupling device is placed between the die 102 and 104. The clear epoxy should have an index of refraction that closely matches that of the light coupling device 100. Note that during chip layout the location of the LED 101 and detector 103 must be coordinated with the location of the "U" shaped light wave guide 100A. After curing the epoxy die attach and the epoxy between the "U" shaped wave guide 100A and the chip 102 and 105's surfaces, wire bonding is performed followed by injection molding which is typically used in IC packaging. If the index of refraction of the package molding compound and the that of the clear light coupling device 100 is not great enough then a non-conductive coating may have to be applied to the "U" shaped light wave guide 100A before package injection molding so that light does not escape from the light guide 100A.

To help in the alignment of the ends of the "U" shaped light guide 100A to the LED 101 and the light detector 103 it may be necessary to deposit another layer on top of the chips 102 and 105. This layer can be, for example but not limited to, a polyimide coating. After deposition, a masking operation is performed in which holes in the coating over the LED 101 and the light detector 103 are patterned and etched. These holes then act as guides for the "U" shaped ends of the light wave guide 100A. Since the "U" shaped light guide is somewhat flexible, it can be deflected to fit into the holes before the ends of the guide 100A are glued into place over the LED 101 and detector 103. To allow some limited movement in the X direction, the "U" shaped guide 100A of FIG. 1B should be more arched. Also, a circular cross section rather than a square cross section at the ends of the "U" shaped wave guide 100A would better facilitate insertion of the ends of the "U" shaped guide 100A into the holes of the aforementioned coating.

It should be note that the geometry of the "U" shaped light wave guide 100A can be varied to improve efficiency. For example, the top corners of the inverted "U" 100A can be rounded to improve the bending of the light around the corner. Also, the inverted "U" 100A can have a round cross section instead of a square cross section as shown.

Although only one "U" shaped light wave guide 100A is shown more than one can be added to the "I" shaped main body 100C of the light coupling structure 100.

It should be noted that the single support post 100D shown in FIG. 1 may not be sufficient for reasons of mechanical rigidity. However, adding more support columns lowers the optical efficiency since some of the light will make its way down the column. Also, for multiple "U" shaped wave guides 100A on a single "I" shaped body 100C, there may be some cross talk via weak light coupling from the support columns such as 100D.

FIG. 2 shows another embodiment of a light coupling device 200 bridging light between two side by side silicon integrated circuits, 202 and 205. In this embodiment there is no "I" shaped support member. There is only a clear rectangular light tube 200 which is responsible for coupling light from one integrated circuit 202 to the other 205. FIG. 2A is a top down view of the light coupling arrangement and FIG. 2B is a cross section view. Referring to FIG. 2A, the X and Y alignment of the light guide 200 is achieved by etching a groove 207 into integrated circuit substrate 202 and a groove 208 into integrated circuit substrate 205. Note that for tolerance purposes, the groove is slightly larger than the light tube 200 as shown in FIG. 2C. The creation of the groove requires adding a masking step and subsequent silicon etching step to the process. Note that the light tube 200 is contoured to fit into the grooves 207 and 208. The light tube is most easily made using an injected mold plastic process but can also be made from any suitable transparent material. The tube is secured using a clear epoxy glue which has an index of refraction that closely matches that of the light tube 200. Although the tube is shown with a rectangular shape, it can also have a square or round shape where appropriate.

Light from LED 201 of integrated circuit 202 is emitted into the light tube 200 which has a bevel for redirecting the light down the tube parallel to the surface of the integrated circuit 202. The light tube 200 then bends down into the groove 207 of the integrated circuit. The light traverses the gap between the integrated circuits 202 and 205 confined within the tube 200. The light tube then enters into the alignment groove 208 of integrated circuit 205 and bends upward as it exits the groove 208. Finally, light is deflected off of the bevel of 200 and into the light detector 203. Note that the light passes through the clear overcoat or passivation layer 204 of integrated circuit 202 and passivation layer 206 of integrated circuit 205. Note also that the passivation layer 204 is present in groove 207 and that the passivation layer 206 is present in groove 208.

Figure 2B:
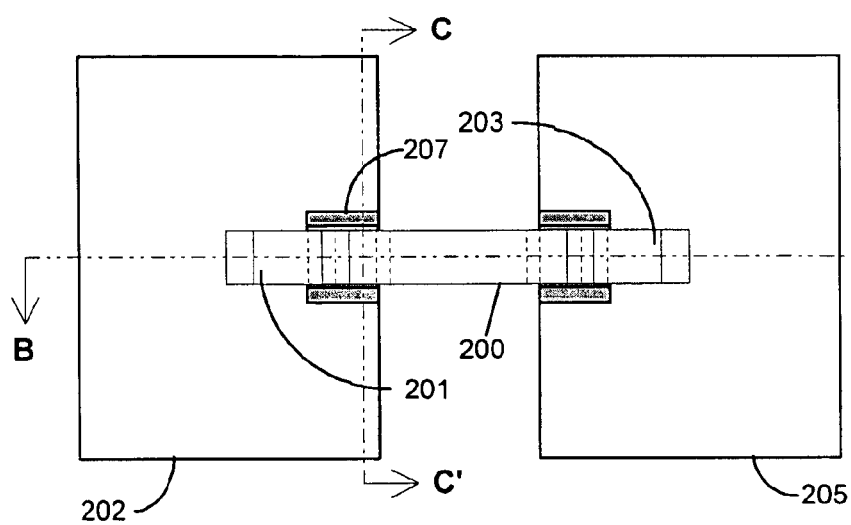
FIG. 2B shows a cross section side view (B-B') of the light coupling device of FIG. 2A.
Figure 2B:
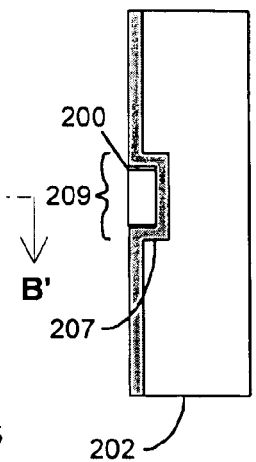
Figure 2B:
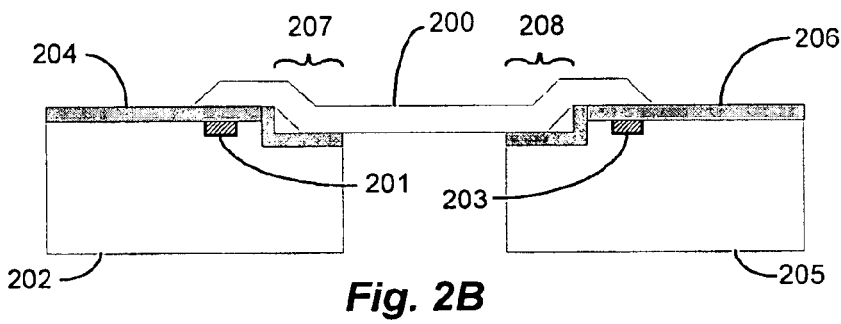
Figure 2D:
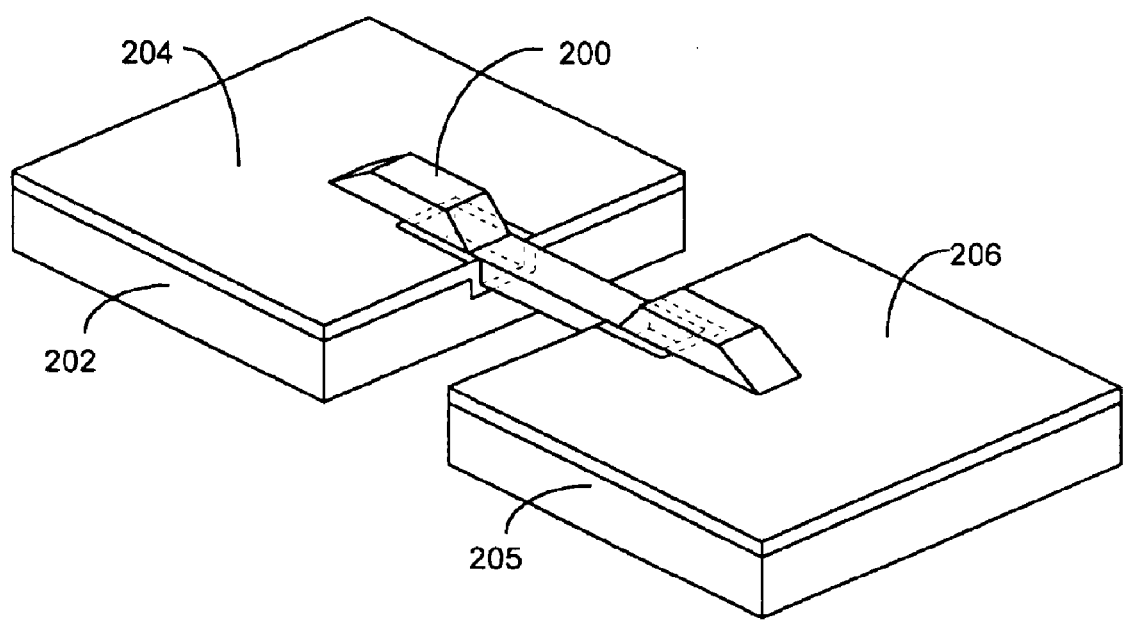
FIG. 2D shows an isometric view of the light coupling device of FIG. 2A.

FIG. 2D is an isometric perspective of the structure depicted in FIGS. 2A, 2B, and 2C. The dotted lines represent the view of the trenches 207 and 208 as it would be seen looking through the transparent light guide 200.

One critical step in the assembly process is the X and Y alignment of the die 202 relative to 205. This can be accomplished by using an insulating spacer form which is placed on the bottom of the lead frame. The form includes cutout holes for each of the two die 202 and 205 with the appropriate die alignment and separation. The spacer form can be made either out of molded plastic or out of any suitable insulating material in which the die holes are stamped. The spacer form is then glued to the lead frame after which the epoxy die attach is performed with the integrated circuit die, 202 and 205, placed in the holes.

Figure 2E:
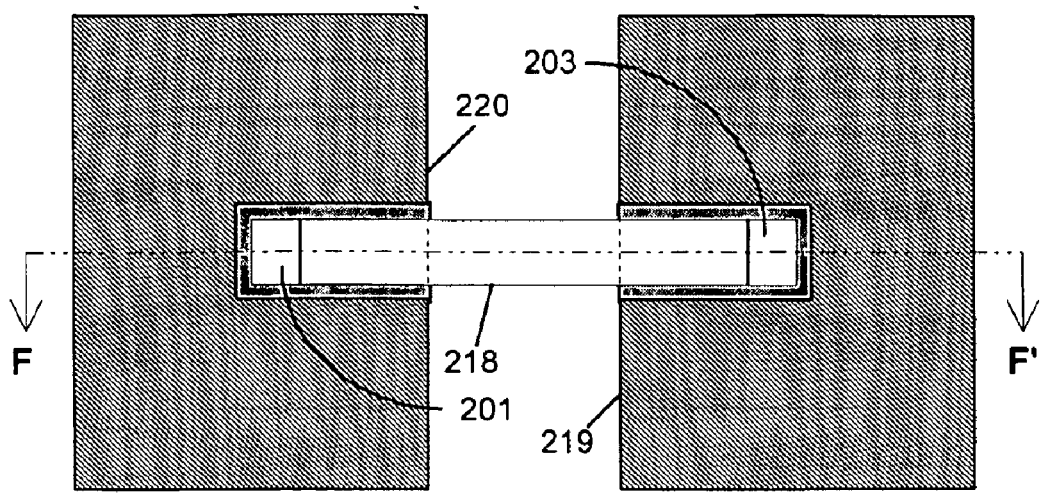
FIG. 2E shows a top view of a light wave guide bar placed between two chips which is used for coupling light from one chip to another and is aligned using trenches in silicon.
Figure 2F:
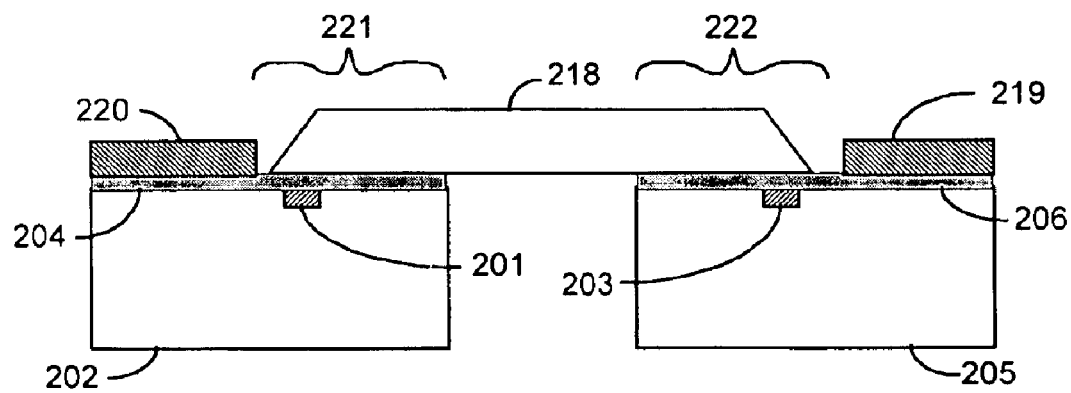
FIG. 2F is a cross section (F-F') of the light coupling device of FIG. 2E.

The alignment trenches 207 and 208 of FIG. 2B can also be made in ways other than etching trenches into silicon. FIG. 2E and FIG. 2F show a different way in which to align a transparent light wave guide 218 to an LED 201 on one chip 202 and to align the guide 218 to a light detector 203 on a second chip 205. A sufficiently thick layer of material, 220 on chip 202 and 219 on chip 205, such as polyimide is deposited on top of the overcoats 204 and 206 of the chips 202 and 205. Next, a trench is etched into thick layer of material creating a slot 221 in the thick material layer 220 and a slot 222 in thick material layer 219. Note that the slots 221 and 222 lie over the LED 201 and detector 203, respectively. A light guide bar 218 is then inserted into the slots 221 and 222. Note that the slots 221 and 222 are slightly larger than the light guide bar 218 for tolerance purposes. Note the light guide bar 218 is beveled at the LED 201 end and at the detector 203 end for the purpose of deflecting the light so that the light emitted by the LED 201 is deflected from the vertical direction and travels down the light guide 218 between chips 202 and 205 in the horizontal or X direction and then is deflected to the vertical direction at the detector 203 so that the light enters the detector 203. The geometry of the light guide bar can either be rectangular, rectangular with rounded edges, or circular in cross section. Using a transparent glue, the light guide 218 is glued into place at the LED 201 end and at the detector 203 end. The light guide 218 should be somewhat flexible to accommodate a small misalignment between chip 202 and chip 205 due to tolerances.

Figure 2G:
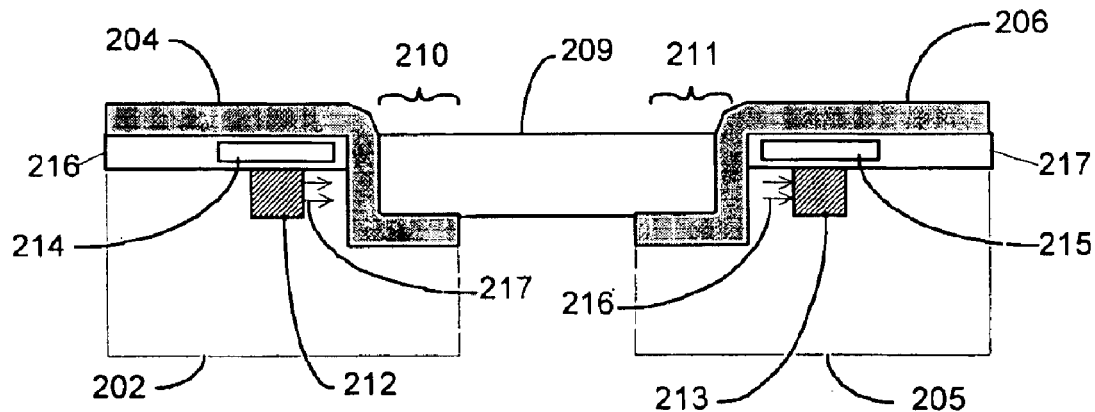
FIG. 2G shows a light guide bar placed between two chips which is used to couple a side light emitting LED of one chip to a side receiving light detector of the second chip.

The light wave guide of FIG. 2B and FIG. 2F assume that the LED 201 emits light in the vertical direction and that light enters the detector in the vertical direction. It is also possible to build a side emitting LED and a side receiving light detector such that light is emitted, travels down the light guide, and is received in the horizontal direction only. FIG. 2G illustrates this case. Chip 202 contains a side emitting LED 212 which emits light 217 horizontally and to the right. Light emitted to the left and downward is absorbed by the silicon. Light emitted upward is deflected by a metal reflecting plate 214 so that at least some of this component of light will be redirected in the horizontal direction and to the right. The metal reflecting plate 214 is embedded in the interlevel dielectric layer 216. Over the interlevel dialectic layer 216 is chip 202's overcoat layer 204. A trench 210 is etched into the silicon 202 so that a transparent light guide bar 209 can receive the light emitted by LED 212 and can be aligned to the LED via the trench 210. Note that the light 217 from the LED 212 passes through the transparent overcoat layer 204.

On the other side of the light guide 209 there is a corresponding trench 211 used to align the light guide 209 to the light detector 213. Light passes from the right end of the guide 209 into the transparent overcoat 206 of chip 205 before entering the light detector 213 area. An optional metal layer 215 embedded in the interlevel dielectric layer 217 is used to guide any light scattered from the main light beam 216 into the detector 213 area. The cross section of the light guide 209 can be either rectangular, rectangular with rounded edges, or circular.

Figure 3A:
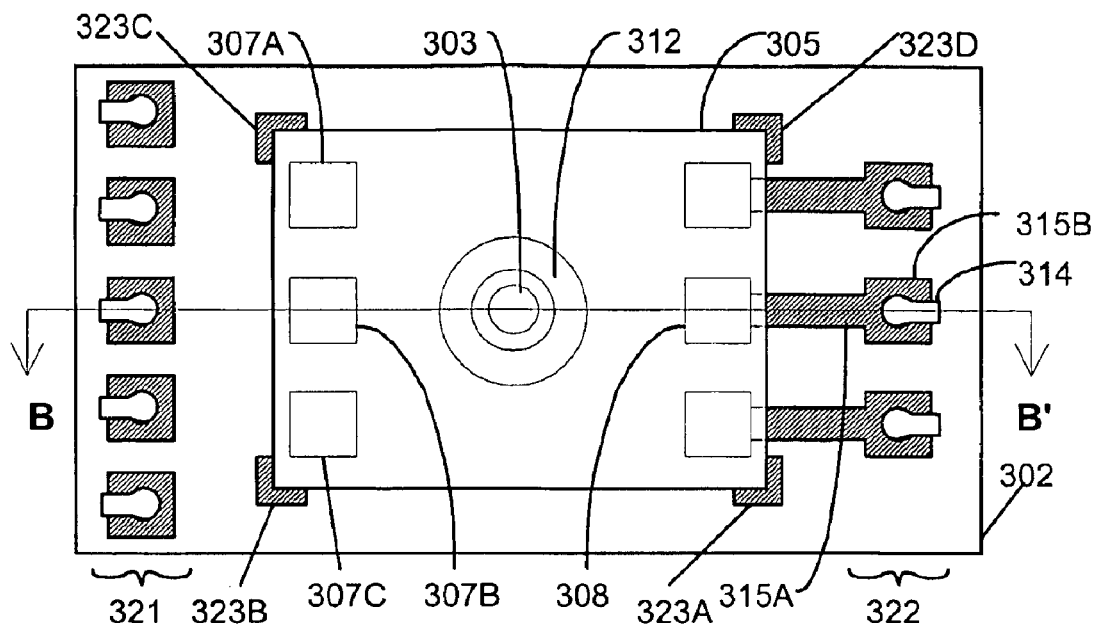
FIG. 3A shows a top view of two silicon integrated circuit die which are optically coupled to each other by using "flip chip" bonding of one die to the top of the other and using a thick deposited dielectric as the transparent insulating medium.
Figure 3B:
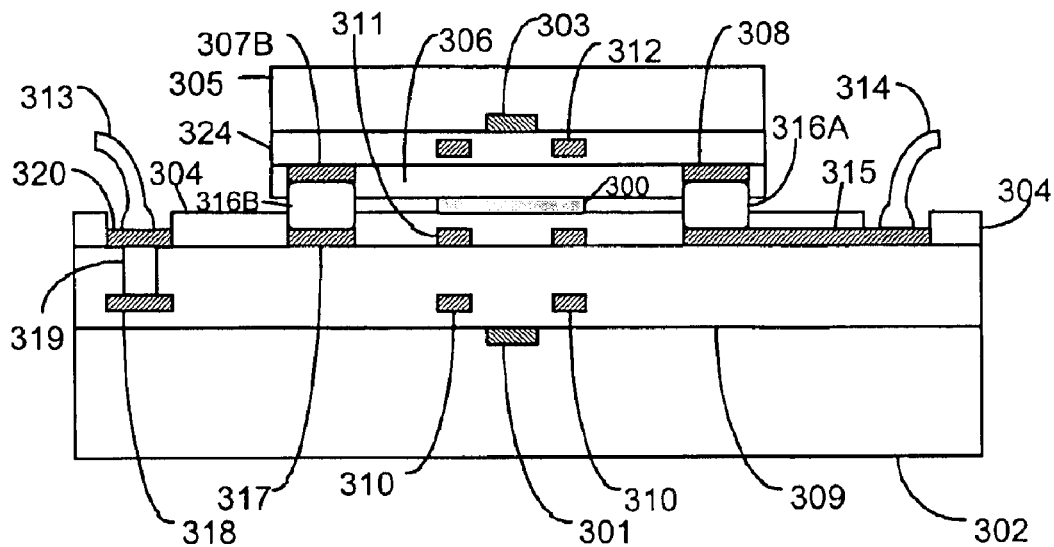
FIG. 3B shows a cross section side view of the opto coupled chip pair of FIG. 3A.

FIG. 3 shows a method for coupling light between integrated circuits in which the transparent insulating barrier is the deposited dielectric normally used between metal layers in an integrated circuit. Such layers which are typically $SiO_2$ can be made as thick as several microns and provide several hundred volts or more of isolation between two integrated circuits or chips. In the example shown in FIG. 3B which is a cross section of the optocoupler two silicon chips, 302 and 305, are shown placed over and facing each other. Chip 302 is shown with two levels of metal; one represented by 318 and 310 and another represented by 320, 317, 311, and 315. The metal layer represented by 318 and 310 is a typical interconnect associated with an integrated circuit. The metal layer represented by 320, 317, 311, or 315 is used primarily for the bonding pads of chip 302 and for bonding pads of chip 305 via a flip chip connection but may also have limited use as interconnect so long as it does not adversely impact the electrical isolation between chips 302 and 305. Although only one "full fledged" metal interconnect layer is shown as represented by 318 and 310, it is understood that there can be more than one level of such metal interconnect. "Full fledged" metal interconnect is defined as interconnect with no routing restrictions other than that imposed by conventional metal layout rules. A tungsten plug such as 319 is used to connect the lower level interconnect with the pad layer metal such as 320.

Because of physical constraints imposed by the pad configuration one of the two chips must be smaller than the other by an amount sufficient to place all of the required bonding pads. In the case of FIG. 3, the chip 305 is smaller than chip 302. The insulating barrier between the chips 305 and 302 is the dielectric material 309 between the interconnect metal such as 310 and the top most metal layer such as 311 of chip 302. To bring out the external connections of chip 305 a "flip chip" bonding approach is used.

To bond out chip 305 the top most metal of chip 302 is used as the flip chip bonding metalization. This metalization includes pad 317 and a metal trace 315 which includes a mating pad for pad 308 of chip 305, a connecting trace 315A, and a bonding pad 315B for external bond wire connections such as 314. Bond pads 321 are provided for the external connections of chip 302's circuitry while bond pads 322 are provided for external connections of chip 305's circuitry via flip chip connections. Bond wire 313 is an example of a bonding connection to one 320 of 302's bonding pads. Bonding pad 317 on chip 302 and its mate, bonding pad 307B of chip 305, have no external bonding connection and, therefore, have no bond wire associated with them. These pads are used for mechanical support only. Solder bumps 316 are used to "flip chip" bond the pads of 305 to the pads of 302 such as pad 307B of chip 305 to pad 317 of chip 302 or pad 308 to pad 315 of chip 302.

The fabrication sequence is to first attach die 302 to a lead frame. Then chip 302 is mated to chip 305 using the flip chip method. Alignment of chip 305 to 302 is provided by the "L" shaped metal alignment marks 323 which are placed on the top most or pad level metal of chip 302. Once mated, the chip pair are wire bonded and then injection molded into a package. An alternate sequence is to perform the flip chip mating before die attach to the lead frame. Also, a hermetically sealed ceramic package can be used instead of the lead frame and injected plastic.

FIG. 3 also shows the optical elements. In this example, as before, a PN junction is assumed for the LED but the LED need not be limited to a PN junction and the detector is also assumed to be a PN junction but could also be a Schottky barrier diode, bipolar transistor, etc. The N+ implant 301 of the LED defines the N region of the diode and the substrate 302 which is assumed to be P type defines the P region of the diode. Note that this example uses PN junctions with circular implants as shown in FIG. 3A but the shape of the junction looking down at the chip could also be rectangular. Light emitted upward from 301 passes through the transparent dielectric 309 which is typically $SiO_2$ as mentioned earlier. The light then passes through the overcoat protection 304 which typically includes Silicon Nitride which is also transparent. To prevent reflections at the overcoat 304—air interface due to differences of the index of refraction between the two, a clear epoxy layer 300 is introduced during the mating of the two chips 302 and 305. This layer needs to exist only in the optical path and has an index of refraction that roughly matches that of the overcoat 304 of chip 302 and the overcoat 306 of chip 305. The overcoat 306 layer of chip 305 is of the same composition as 304. The light then enters the interlevel dielectric 324 of chip 305. Finally, the light from 301 enters the detector junction formed by the N+ implant 303 and the substrate 305.

To minimize light from fanning out and affecting other parts of the circuit light shields 310, 311, and 312 are used. These shields are made from the interconnect metal layers. Although light is reflected off these layers if made of only Aluminum they scatter the light thereby making it more diffuse. If most modem processes, barrier metals are used on the upper and lower surfaces of the Aluminum interconnect. Fortunately, barrier metals tend to absorb light rather that reflect it thus making the shields more effective at preventing stray light from reaching unintended areas of a circuit. Note that in the example shown in FIG. 3 these shields are laid out as a concentric ring around the circular N+ implant associated with the LED 301 and detector 303. These shields can include all levels of metal interconnect with tungsten plugs helping to confine the light inside the rings. Of course, tungsten plugs going from the shield ring associated with the pad level of metal to a shield ring associated with a lower interconnect level can not be used because of the isolation requirement. If a high degree of light shielding is required then the width of the shields can be expanded at the expense of lost interconnect area for the case of shields 312 and 310. Also, because of capacitive coupling between the shields 310 and 312 of chips 302 and 305, respectively, it is desirable to make the shields large and to connect them either to power or ground of the respective power supplies of these two chips. Thus, with large shields connected to power or ground, any capacitive or displacement current between the two chips is largely confined to the power or ground nodes of each chip and not between signal nodes. The interchip capacitance for this packaging approach can be on the order of 10's of pF.

More than one LED-detector pair such as 301–303 can be used in a pair of isolated chips depicted in FIG. 3. It is immaterial as to which of the two chips contains a given LED and which contains the corresponding detector. Thus, bi-directional signal transmission between chips can be achieved over a plurality of optically isolated channels via multiple LED-detector pairs for a pair of isolated chips. For multiple sets of LED-detector pairs there are layout spacing considerations so that there is little cross talk between LED-detector pairs. It should be noted that light emitted within the silicon from a local on chip LED is attenuated by simply providing a wide spacing between the LED and light susceptible circuits. For example, for yellow light, the absorption coefficient is ½ $\mu$m in silicon. At 15 $\mu$m distance, the light intensity in silicon is less than $\frac{1}{1000}^{th}$ than that at the light source. Hole-electron pairs generated in the substrate by stray light from a nearby LED can be collected by reversed biased junctions placed around the LED.

Unfortunately, the stacked chip approach as depicted in FIG. 3 has limitations with respect to the voltage tolerance of the transparent isolation barrier. There is a practical limit as to how thick the deposited dielectric isolation barrier can get because of film stresses and the thickness of the tungsten via plugs. For very large isolation voltages, i.e. isolation voltages in the range of thousands of volts, a separately manufactured transparent barrier plate can used as depicted in FIG. 4. This approach is similar to that of FIG. 3 except that instead of using the normal deposited $SiO_2$ dielectric found in conventional silicon semiconductor manufacturing as the transparent isolation barrier a separate transparent barrier plate 404 is used instead. This approach avoids the thickness limitations of the approach depicted in FIG. 3 and therefore can attain higher isolation voltages at the expense of added manufacturing cost. Unfortunately, if multiple LED-detector pairs are used wider spacing between such pairs is required as the thickness of the insulating barrier is increased because of crosstalk.

Figure 4A:
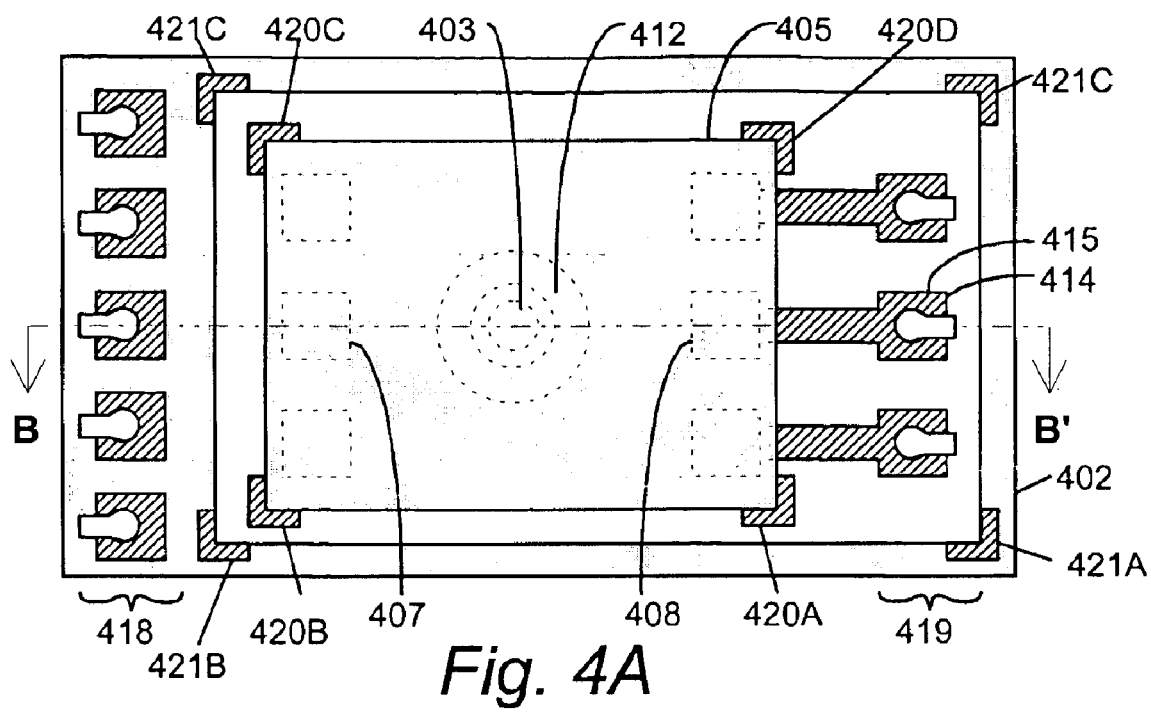
FIG. 4A shows a top view of a "flip chip" pair of optically coupled integrated circuit die similar to FIG. 3A except that the transparent insulating barrier is a block of transparent material with a metal bonding pattern on top for the "flip chip" connection.
Figure 4B:
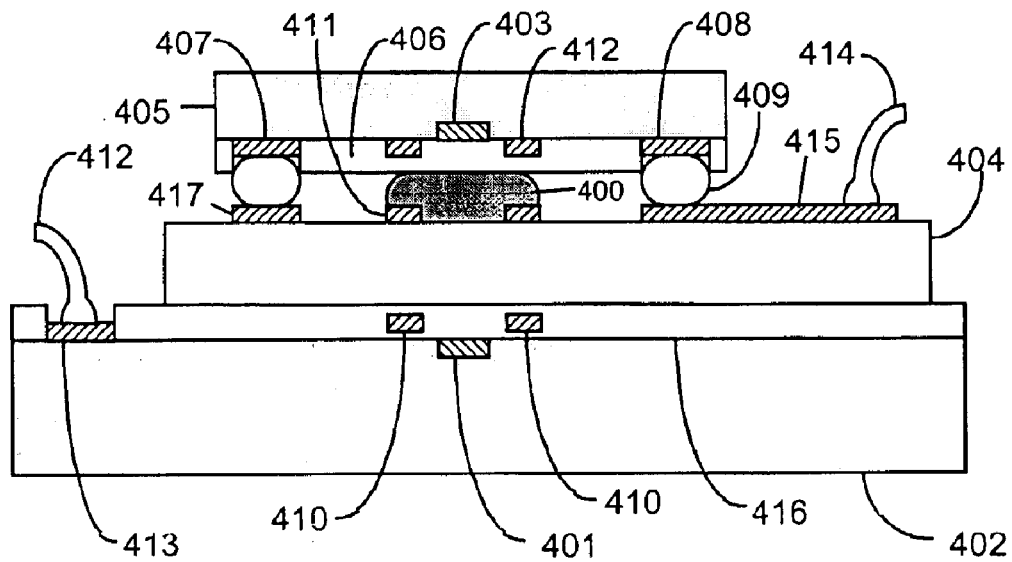
FIG. 4B show a cross section side view of the opto coupled chip pair of FIG. 4A.

Referring to FIG. 4, as before, there are two electrically isolated silicon chips 402 and 405. A transparent overcoat or protective layer, 416 and 406, is shown for each chip. Shown in FIG. 4B is an example of a bond pad 413 and bond wire 424 for chip 402 and an example of a support only bond pad 407 and an externally connected bond pad 408 of chip 405. Wire bonding pads 418 are used to connected chip 402 to the package pins and pads 419 are used to connect chip 405 to package pins. Also shown are a metal light shield 412 of chip 405, a metal light shield 410 of chip 402, and a light shield 411 of the isolation barrier plate 404. The LED is represented by the implant 401 and the detector implant 403.

The isolation barrier plate 404 is made from any transparent insulating material such as but not limited to plastic or glass. A metal film is deposited on the material and a pad pattern is then etched including wire bonding pads 419 and flip chip bonding pads such as 417 and 415. In the cross section of FIG. 4B a mechanical support pad 417 and external connection metal 415 are shown which are made from the metal film of 404. Also present are "L" shaped alignment marks 420 made from patterning the metal film. The isolation plate 404 is secured to the chip 402 by using a suitable glue with an index of refraction that closely matches that of the overcoat protection 416 and the isolation plate 404. If the index of refraction is different between the overcoat 416 and the isolation plate 404 then the glue's index of refraction should be selected between these two indices. Note that there are alignment marks 421 which are "L" shaped traces made in the top most metal layer of chip 402 and are used to align the isolation plate 404 to the chip 402 before the glue between chip 402 and plate 404 cures. Note that the alignment marks 420 and 421 are "L" shaped in this example but can be other shapes as well such as crosses.

After the aforementioned glue cures securing 404 to 402 solder bumps 409 are placed on the pads of chip 405 and transparent glue 400 is placed over the detector 403 which in this example is a diode with an N+/P substrate junction. The glue should have an index of refraction comparable to that of the overcoat 406 of chip 405 and to that of isolation plate 404. Next, chip 405 is mated with the isolation plate pads such as 417 using flip chip technology. Alignment between the isolation plate 404 and the chip 405 is made with the help of alignment marks 420 which are made in the metal layer on the isolation plate 404. If necessary, finer alignments can be made using an infra-red microscope which can look through the silicon chip 405. With the IR microscope and an IR light source the light shields 412 and 410 can be used to align 405 to 402. The advantage of finer alignment is increased optical coupling efficiency.

As in the case of FIG. 3, light emitted by the LED 401 must pass through several layers including the interlevel dielectric 423, the overcoat layer 416 of chip 402, the isolation barrier plate 404, the gap fill 400, the overcoat layer 406 of chip 405, and the interlevel dielectric 422 of chip 405. A light shield 410 is provided on chip 402 and a light shield 412 is provided on chip 405.

After mating the two chips 402 and 405 wire bonding is performed between the bond pads 418 of chip 402 and the package pins and wire bonding between the bond pads 419 of isolation plate 404 and the package pins. Example of wire bonds include 414 of pad 415A and 412 of pad 413. The final step is injection molding if the package is to be plastic.

Note that the fabrication sequence described above can be varied with respect to the order of the aforementioned assembly steps.

Figure 4C:
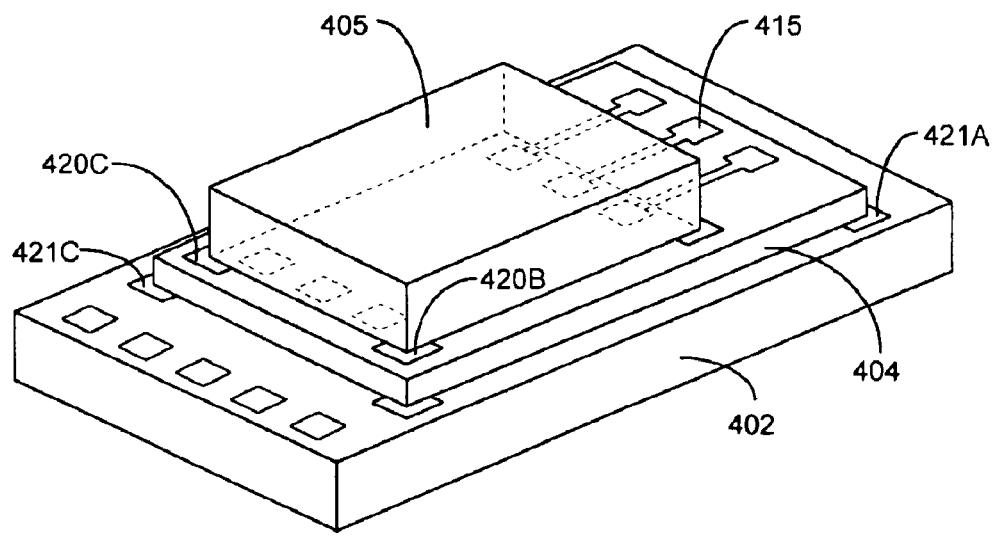
FIG. 4C is an isometric view of the opto coupled chip pair of FIG. 4A.

FIG. 4C shows a simplified isometric view of the two chip optically coupled structure of FIGS. 4A and 4B. The overcoat and detail of the bonding pad stack associated with chip 405 and the isolation plate 404 have been omitted so as not to clutter the figure. The hidden features are shown as dotted lines and include the pad structure of chip 405, the exposed pad structure of isolation plate 404, and the hidden surfaces of chip 405. The hidden surfaces of chip 405 are shown to give the hidden pads perspective.

Note that the isolation barrier plate 404 can be also made of a deposited transparent material such as, but not limited to, $SiO_2$. This is done by depositing a layer of the transparent material on top of the silicon nitride overcoat layer 416. After the transparent material deposition, metal is deposited on top of the transparent material and patterned thus making the flip chip interconnect such as 417 and 415. After patterning the metal, photo resist is applied and masked so that chip 402's pad areas 418 are exposed to a selective etch which etches only the transparent material 404. Using the silicon nitride overcoat 416 as the etch stopping layer, the transparent material 404 over chip 402's pads 418 is removed. After removal, a pad opening mask is applied which opens the overcoat layer over chip 402's pads 418 such as 413. Thus, isolation plate 404 which is a deposited layer and its flip chip metalization can be made using conventional silicon processing if $SiO_2$ is used as the deposited layer. In this case, unlike that of FIG. 3, there is no tungsten plug height limitation.

Figure 5:
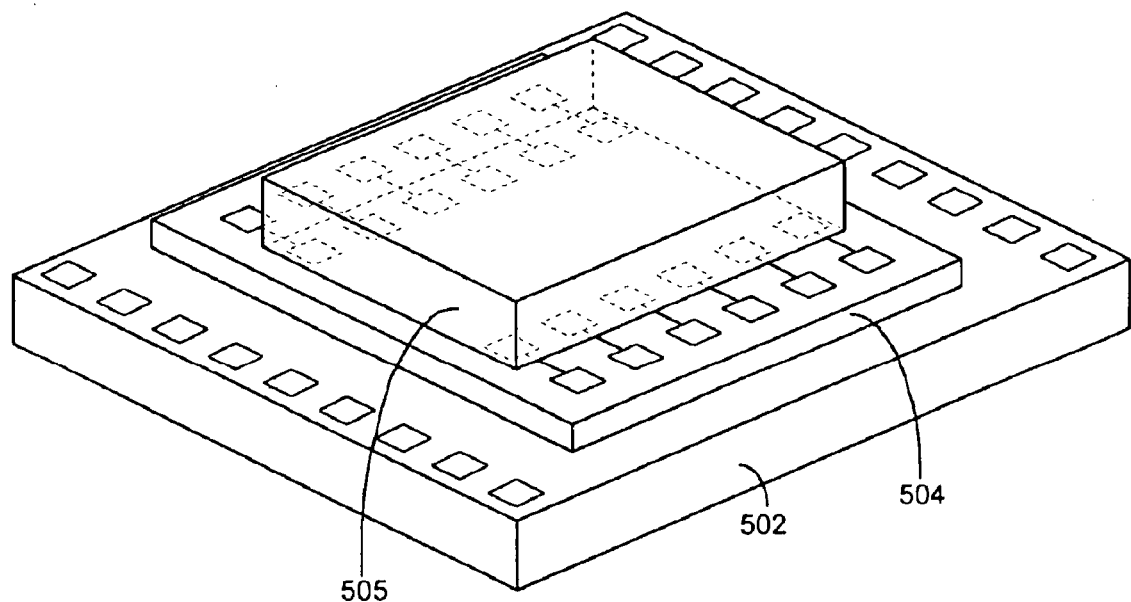
FIG. 5 is an isometric view of an opto coupled chip pair similar to that of FIG. 4 except that the bond pads are on two sides of each chip instead of one side.

FIG. 5 shows a simplified isometric view of a two chip optically coupled structure similar to that of FIG. 4C except that an additional side of pads has been added to each chip. In this pad scheme chip 502 has two rows of pads on opposite ends of the chip and chip 505 also has two rows of pads on opposite ends of the chip with an insulating transparent barrier 504 in between the chips. Thus, this arrangement can handle more bonding pads than the arrangement depicted in FIG. 4. The only limitation is that package pins of chip 502 are inherently closer to those of chip 505 than would be the case if the pads could be located on only one side per chip. Thus, the isolation voltage for this pad arrangement tends to be lower than the pad arrangement of FIG. 4. Other pad arrangements are also possible such as the bonding pads of 505 being on one side and the bonding pads of 502 being on three sides, etc.

While various embodiments of the application have been described, it will be apparent to those of ordinary skill in the art that many more embodiments and implementations are possible that are within the scope of the subject invention. Therefore, the invention is not to be restricted or limited except in accordance with the following claims and their equivalents.

What is claimed is:

1. An optical coupler, comprising:
   a first chip, comprising
      a substrate;
      a light emitter integrated onto the substrate; and
      a dielectric layer formed over the substrate; and
   a second chip having an integrated light detector;
   wherein the second chip is disposed on ton of the dielectric layer of the first chip such that the light emitter of the first chip faces the light detector of the second chip, and wherein the first chip comprises a first bonding pad formed on the dielectric layer, the second chip comprises a second bonding pad, and the first bonding pad is electrically coupled to the second bonding pad.

2. The optical coupler of claim 1, wherein the first bonding pad is electrically coupled to the second bonding pad by a solder bump.

3. The optical coupler of claim 1, wherein the first chip comprises a third bonding pad formed on a portion of the dielectric layer that does not overlap the second chip.

4. The optical coupler of claim 3, wherein the first chip comprises a conductive trace formed on the dielectric layer, the conductive trace electrically coupling the first bonding pad to the third bonding pad.

5. The optical coupler of claim 4, wherein the conductive trace is made of metal.

6. An optical coupler, comprising:
   An optical coupler, comprising:
      a first chip, comprising a substrate;
a light detector integrated onto the substrate; and
a dielectric layer formed over the substrate; and
a second chip having an integrated light emitter;
wherein the second chip is disposed on top of the dielectric layer of the first chip such that the light detector of the first chip faces the light emitter of the second clip, and wherein the first chip comprises a first bonding pad formed on the dielectric layer, the second chip comprises a second bonding pad, and the first bonding pad is electrically coupled to the second bonding pad.

7. The optical coupler of claim 6, wherein the first bonding pad is electrically coupled to the second bonding pad by a solder bump.

8. The optical coupler of claim 6, wherein the first chip comprises a third bonding pad formed on a portion of the dielectric layer that does not overlap the second chip.

9. The optical coupler of claim 8, wherein the first chip comprises a conductive trace formed on the dielectric layer, the conductive trace electrically coupling the first bonding pad to the third bonding pad.

10. The optical coupler of claim 9, wherein the conductive trace is made of metal.

11. An optical coupler, comprising:
a first chip having an integrated light emitter;
a second chip having an integrated light detector, wherein the light emitter of the first chip faces the light detection of the second chip; and
an optically transparent barrier plate interposed between the first and second chip, wherein the transparent barrier plate is made of plastic.

12. An optical coupler, comprising:
a first chip having an integrated light emitter;
a second chip having an integrated light detector, wherein the light emitter of the first chip faces the light detection of the second chip;
an optically transparent barrier plate interposed between the first and second chip; and
a first bonding pad formed on the transparent barrier plate, and wherein the second chip comprises a second bonding pad, the second bonding pad being electrically coupled to the first bonding pad on the barrier plate.

13. The optical coupler of claim 12, wherein the second bonding pad is electrically coupled to the first bonding pad by a solder bump.

14. The optical coupler of claim 13, further comprising a third bonding pad formed on a portion of the transparent barrier plate that does not overlap the second chip.

15. The optical coupler of claim 14, further comprising a conductive trance formed on the transparent barrier plate, the conductive trance electrically coupling the first bonding pad to the third bonding pad.

16. The optical coupler of claim 15, wherein the conductive trace is made of metal.

17. The optical coupler of claim 14, wherein the first chip comprises a fourth bonding pad that does not overlap the transparent barrier plate.

* * * * *